United States Patent

Weissenberger et al.

[11] Patent Number: 5,623,207
[45] Date of Patent: Apr. 22, 1997

[54] METHOD FOR AVOIDING IMAGE OCCLUSIONS IN NUCLEAR MAGNETIC RESONANCE TOMOGRAPHY APPARATUS THAT ARE OPERATED WITH MULTI-ECHO SEQUENCES

[75] Inventors: Volker Weissenberger, Moehrendorf; Peter Heubes, Poxdorf, both of Germany

[73] Assignee: Siemens Aktiengesellschaft, Munich, Germany

[21] Appl. No.: 650,639

[22] Filed: May 20, 1996

[30] Foreign Application Priority Data

Jun. 1, 1995 [DE] Germany .................. 195 20 203.1

[51] Int. Cl.$^6$ ..................................................... G01V 3/00
[52] U.S. Cl. ........................... 324/309; 324/300; 324/307
[58] Field of Search ..................................... 324/300, 306, 324/307, 309, 311, 312, 314

[56] References Cited

U.S. PATENT DOCUMENTS

| | | | |
|---|---|---|---|
| 4,818,940 | 4/1989 | Hennig et al. | 324/309 |
| 5,162,730 | 11/1992 | Schmitt et al. | 324/309 |
| 5,270,654 | 12/1993 | Feinberg et al. | 324/309 |
| 5,281,916 | 1/1994 | Hinks et al. | 324/300 |
| 5,347,218 | 9/1994 | Van Yperen | 324/309 |
| 5,493,224 | 2/1996 | Shiono et al. | 324/309 |

FOREIGN PATENT DOCUMENTS 4004184  8/1994  Germany .

OTHER PUBLICATIONS

"Fast MRI By Creating Multiple Spin Echoes In A CPMG Sequence," Oshio et al., Magnetic Resonance In Medicine, vol. 30 (1993) pp. 251–254.

"Phase Errors In NMR Images," Norris, SMRM Abstracts 1985, pp. 1037–1038.

"EPI Spatial Distortion In Non–Transverse Planes," Coxon et al., SMRM Abstracts 1989, p. 361.

"Concomitant Magnetic Field Gradients and Their Effects On Imaging At Low Magnetic Field Strengths," Norris, Magnetic Resonance Imaging, vol. 8 (1990) pp. 33–37.

"Nonaxial Whole–Body Instant Imaging," Weisskoff et al., Magnetic Resonance In Medicine, vol. 29 (1993), pp. 796–803.

Primary Examiner—Louis M. Arana
Attorney, Agent, or Firm—Hill, Steadman & Simpson

[57] ABSTRACT

In a method for avoiding image occlusions in nuclear magnetic resonance tomography apparatus that are operated with multi-echo sequences, at a time $t_0$, a cross-magnetization in spins is generated in an examination subject with an excitation radio-frequency pulse. At times $t_1, t_3, t_5 \ldots$, at least two refocusing radio-frequency pulses that re-phase the cross-magnetization follow and read-out intervals follow at times $t_2, t_4, t_6 \ldots$. The following condition is satisfied in at least one direction for the gradients G activated during the pulse sequence:

$$\int_{t_0}^{t_1} G^2(t)dt = \frac{1}{2} \int_{t_1}^{t_3} G^2(t)dt =$$

$$\frac{1}{2} \int_{t_3}^{t_5} G^2(t)dt = \ldots = \frac{1}{2} \int_{t_{2n-3}}^{t_{2n-1}} G^2(t)dt$$

Even given quadratic gradient terms, thus, no phase difference occurs between a primary and a stimulated echo path. The presence of such a phase difference causes an image occlusion, and thus such occlusions are avoided by eliminating such a phase difference.

6 Claims, 8 Drawing Sheets

METHOD FOR AVOIDING IMAGE OCCLUSIONS IN NUCLEAR MAGNETIC RESONANCE TOMOGRAPHY APPARATUS THAT ARE OPERATED WITH MULTI-ECHO SEQUENCES

BACKGROUND OF THE INVENTION

1. Field of the Invention

The invention is directed to a method for avoiding image occlusions in the production of images using a nuclear magnetic resonance tomography apparatus are operated with multi-echo sequences of the type wherein a cross-magnetization of spins is generated in an examination subject at a time to with an excitation radio-frequency pulse, this excitation radio-frequency pulse being followed at times $t_1, t_3, t_5$, ... by at least two refocusing radio-frequency pulses that re-phase the cross-magnetization, and read-out intervals following at times $t_2, t_4, t_6$, ...

2. Description of the Prior Art

Imaging sequences known as multi-echo sequences that have the following features in common. A first radio-frequency pulse (excitation radio-frequency pulse) generates a cross-magnetization. At least two further radio-frequency pulses (radio-frequency refocusing pulses) that follow the radio-frequency excitation pulse re-phase this cross-magnetization and thus generate measurable MR signals triggered by the first pulse. For example, these MR signals can be phase-encoded in the same way, so that the relaxation of the nuclear magnetic resonance signal can be observed or the signal-to-noise ratio can be approved by averaging. It is more standard in modern applications, however, to select a different phase-encoding of the MR signals generated following the excitation radio-frequency pulse, so that the data acquisition for the reconstruction of a MR image becomes faster. Such methods are referred to as turbo-spin echo sequences. A measuring time that is shortened further is achieved when, following every refocusing radio-frequency pulse, the read-out gradient is also multiply reversed, and thus a plurality of signals are respectively acquired. Such a pulse sequence as disclosed in U.S. Pat. No. 5,270,654 is referred to as a gradient spin echo sequence.

It is known that a switched, linear magnetic field gradient as inherently required for the MR imaging cannot be generated isolated in a basic field. On the contrary, switched magnetic field gradients are always connected to transverse field components as a result of the Maxwell equations. This problem is discussed in a number of references.

D. G. Norris "Phase Errors in NMR Images", SMRM Abstracts 1985, pp. 1037–1038 points out the problem of phase distortions due to an undesirable gradient component in conjunction with the traditional spin-warp technique. For solving this problem, it is proposed that one bipolar pulse be replaced by two mono-polar pulses separated by a 180° radio-frequency pulse.

The problem that has been presented is primarily discussed in conjunction with echo planar imaging (EPI) in the literature. This stems from the fact that the undesired effect becomes more disturbing as the gradient amplitude becomes higher in relationship to the basic magnetic field. Especially short, and thus high, gradients are required, however, in the EPI method. The following solutions have thereby been proposed.

R. Coxon and P. Mansfield "EPI Spatial Distortion in Non-Transverse Planes", SMRM Abstracts 1989, p. 361 propose that the spatial distortion caused by undesired gradient components be eliminated by after-processing in the acquired data sets or by dynamic adjustment of shim currents.

D. G. Norris and J. Hutchinson "Concomitant Magnetic Field Gradients and Their Effects on Imaging at Low Magnetic Field Strength", Magnetic Resonance Imaging, Vol. 8, pp. 33–37, 1990, propose for spin echoes, the use of bipolar pulses as applied, for example, for refocusing given flux, be replaced by using unipolar pulses. These unipolar pulses are separated by a 180° radio-frequency pulse, so that they have the effect of a bipolar pulse.

R. M. Weisskoff et al. "Nonaxial Whole-Body Instant Imaging" MRM 29, pp. 796–803 (1993) suggest inserting a pre-phasing gradient between a 90° pulse and a 180° for the reduction of phase errors in a EPI pulse sequence.

None of these references, however, is concerned with multi-echo imaging. It has been found that occlusions occur in the image given multi-echo sequences, particularly when the gradient field strength is high in comparison to the basic field strength. The problem thus becomes especially serious given low basic field strengths and/or strong gradients.

SUMMARY OF THE INVENTION

It is an object of the present invention to provide a method of the type initially described wherein these occlusions are avoided.

The above object is achieved in accordance with the principles of the present invention in a method for operating a nuclear magnetic resonance tomography apparatus, so as to avoid image occlusions, wherein nuclear spins are excited in an examination subject at a time $t_0$ with a excitation radio-frequency pulse, the radio-frequency pulse is followed at times $t_1, t_3, t_5$ ... by at least two refocusing radio-frequency pulses to re-phase the cross-magnetization, wherein gradients are activated during the sequence which satisfy the following condition in at least one direction:

$$\int_{t_0}^{t_1} G^2(t)dt = \frac{1}{2}\int_{t_1}^{t_3} G^2(t)dt =$$

$$\frac{1}{2}\int_{t_3}^{t_5} G^2(t)dt = \ldots = \frac{1}{2}\int_{t_{2n-3}}^{t_{2n-1}} G^2(t)dt$$

wherein n is a natural number, and wherein the resulting nuclear magnetic resonance signals are read-out at times $t_2, t_4, t_6$ ...

DESCRIPTION OF THE PREFERRED EMBODIMENTS

Figure 1:
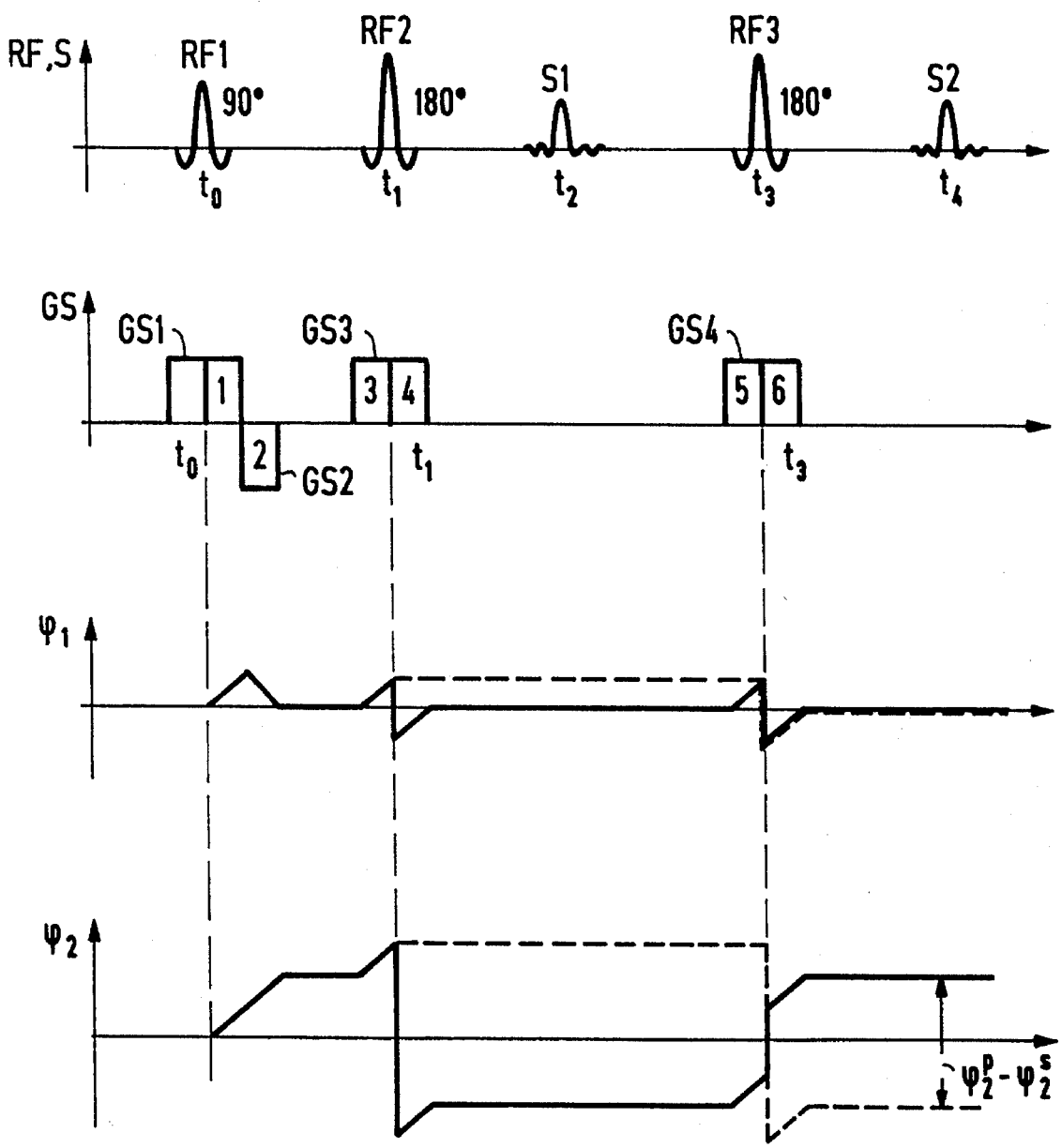
FIG. 1 shows a conventional multi-echo pulse sequence with a slice-selection gradient GS activated in the standard way and the associated phase curves for liner and quadratic gradient terms for explaining the problem to which the inventive method is directed.

For explaining the problem to which the inventive method, the occurrence of transverse field components given activated magnetic field gradients shall be explained first with reference to the Maxwell equation. It is assumed in the following considerations that a Cartesian coordinate system is selected with its z-axis in the direction of the principal magnetic field. A gradient G having the field components $B_x$, $B_y$ and $B_z$ generates the following magnetic field $\vec{B}$ in conjunction with the basic magnetic field $B_0$ at point x, y, z:

$$\vec{B} = (B_0 + B_z)\vec{e}_z + B_x\vec{e}_x + B_y\vec{e}_y \tag{1}$$

wherein $\vec{e}_x$, $\vec{e}_y$, $\vec{e}_z$ are unit vectors in the respective directions. The absolute value of B is relevant for the MR imaging:

$$|\vec{B}| = \sqrt{(B_0 + B_z)^2 + B_x^2 + B_y^2} \tag{2}$$

$$\approx B_0 + B_z + \frac{B_x^2 + B_y^2}{2B_0} + \ldots \tag{3}$$

For low gradient fields, only the two first terms $B_0$ and $B_z$ are normally taken into consideration, these describing the uniform basic field in combination with the linear field gradient. For gradients that are strong in relationship to the basic magnetic field, the terms of the second order can no longer be left out of consideration. The following derives from the Maxwell equations for the x-gradient having the strength $G_x$:

$$G_x = \frac{\partial B_z}{\partial x} \rightarrow B_z = \int \frac{\partial B_z}{\partial x} dx = G_x x \tag{4}$$

$$\vec{rotB} = 0 \rightarrow \frac{\partial B_z}{\partial x} - \frac{\partial B_x}{\partial z} = 0 \rightarrow B_x = \tag{5}$$

$$\int \frac{\partial B_x}{\partial z} dz = \int \frac{\partial B_z}{\partial x} dz = G_x z$$

$$|\vec{B}| = B_0 + G_x x + \frac{G_x^2 z^2}{2B_0} \tag{6}$$

This means that an x-gradient generates a quadratic field-dependency of the second order in the z-direction. A similar result derives for a y-gradient having the strength $G_y$:

$$|B| = B_0 + G_y y + \frac{G_y^2 z^2}{2B_0} \tag{7}$$

Given the assumption of a cylindrical symmetry, the following derives for a z-gradient having the strength $G_z$:

$$G_z = \frac{\partial B_z}{\partial z} \rightarrow B_z = \int \frac{\partial B_z}{\partial z} dz = G_z z \tag{8}$$

$$\vec{divB} = 0 \rightarrow \frac{1}{\rho}\frac{\partial \rho B_\rho}{\partial \rho} \frac{\partial B_z}{\partial z} = 0 \rightarrow \frac{\partial(\rho B_\rho)}{\partial \rho} = -\rho G_z \tag{9}$$

$$\rho B_\rho = \int -\rho G_z d\rho = -\frac{1}{2}\rho^2 G_z \tag{10}$$

$$\sqrt{B_x^2 + B_y^2} = B_\rho = -\frac{1}{2}\rho G_z = -\frac{1}{2}\sqrt{x^2+y^2}\, G_z \tag{11}$$

$$|\vec{B}| = B_0 + G_z z + \frac{G_z^2(x^2+y^2)}{8B_0} \tag{12}$$

This means that a z-gradient in the radial direction generates a quadratic term.

The aforementioned, undesired quadratic terms occur in all systems regardless of the gradient coil design and are especially disturbing given low-field systems and given high gradients.

It has been found that the aforementioned quadratic terms in multi-echo sequences lead to interferences that represent the cause for the occlusions that have been observed. This is explained in greater detail below with reference to FIG. 1.

FIG. 1 shows a conventional multi-echo sequence, whereby only the slice selection gradient GS of the required gradients is considered here.

At the beginning of the sequence, a radio-frequency excitation pulse RF1 is emitted initially under a positive gradient GS1. The nuclear spins are thereby deflected by 90°, i.e., a cross-magnetization is generated. The phase curve due to the (desired) linear terms of the slice-selection gradient GS1 are referenced $\phi 1$, and $\phi 2$ references the phase curve due to quadratic terms. As may be seen, the phase $\phi 1$ as well as the phase $\phi 2$ increases in the second half (reference 1) of the slice-selection gradient GS1. For re-phasing, a negative gradient G2 is activated under which, however, only a re-phasing of the $\phi 1$ term ensues, whereas the $\phi 2$ term continues to increase.

At time $t_1$, a refocusing radio-frequency pulse RF2 is emitted to the spins, again under the influence of a slice-selection gradient GS3. It thereby must be taken into consideration that this pulse, as a result of a non-ideal 180° rotational angle, not only reverses the existing cross-magnetization but also initiates the generation of a stimulated echo. The phase in the stimulated echo path is indicted with dots in FIG. 1. In the primary echo path, the phase initially increases with respect to the term $\phi 1$ as well as with respect to the term $\phi 2$ in the first half 3 of the slice-selection gradient GS3 and is then inverted. The phase relation for both terms $\phi 1$, $\phi 2$ remains present in the stimulated path.

At time $t_2$, a spin echo system S1 arises, as a purely primary echo having the overall phase $\phi(S1)$:

$$\phi(S1) = \phi_1(S1) + \phi_2(s1) = -Y\int_{t_0}^{t_1} B(t)dt + Y\int_{t_1}^{t_2} B(t)dt \tag{13}$$

A further refocusing radio-frequency pulse under the influence of a slice-selection gradient GS4 follows at time $t_3$. Here, the phase relation is inverted not only in the primary echo path but also in the stimulated echo path, with respect to the linear gradient terms as well as with respect to the quadratic terms. A second spin echo S2 thus arises at time $t_4$.

This second spin echo S2 and all following spin echoes represent a superimposition of primary and stimulated echoes with various phase relations. The phase relation for the primary component, referenced with the superscript "p", is:

$$\phi^p(S2) = \phi_1^p(S2) + \phi_2^p(S2) = \tag{14}$$

$$Y \int_{t_0}^{t_1} B(t)dt - Y \int_{t_1}^{t_3} B(t)dt + Y \int_{t_3}^{t_4} B(t)dt$$

The phase relation of the stimulated component, referenced with a superscript "s", is:

$$\phi^s(S2) = \phi_1^s(S2) + \phi_2^s(S2) = -Y \int_{t_0}^{t_1} B(t)dt + Y \int_{t_3}^{t_4} B(t)dt \quad (15)$$

These phases must be identical for a correct echo superimposition:

$$\phi^s(S2) = \phi^p(S2) \quad (16)$$

This condition—as may also be seen from the curve of $\phi_1$ according to FIG. 1—is met $\phi_1^p - \phi_1^s = 0$ for linear gradient terms. When, however, the terms of the second order according to equations 6, 7 and 12 are taken into consideration, the condition is not met. These terms lead to location-dependent phase differences between the various echo types. In the worst case, the superimposition of two echo types leads to a quenching when the phase difference becomes equal to $\pi$.

$$\phi_2^p - \phi_2^s = 2Y \int_{t_0}^{t_1} B(t)dt - Y \int_{t_1}^{t_3} B(t)dt \quad (17)$$

When, for example, $G_x$ is the slice-selection gradient, $B(t)$ is obtained from equation 6. When the terms of the second order are considered, the phase difference $\phi_2^p - \phi_2^s$ of the terms of the second order illustrated in FIG. 1 are obtained as follows:

$$\phi_2^p - \phi_2^s = Y \frac{z^2}{2B_0} \left( 2 \int_{t_0}^{t_1} G_x^2(t)dt - \int_{t_1}^{t_3} G_x^2(t)dt \right) \quad (18)$$

The following parameters are assumed in the following example:

Pulse duration of sub-pulses 1–6, according to FIG. 1=2.4 ms

Gradient strength $|G_x|=7.0$ mT/m

For a low-field system having a basic field strength of 0.2 T, the following is obtained at the position $|z|=10$ cm:

$$\phi_2^p - \phi_2^s = 2 \frac{3\pi}{4} - \frac{\pi}{2} = \pi \quad (19)$$

This means that a destructive interference of primary and stimulated echoes with strong signal loss occurs at the position $|z|=10$ cm.

It has thus been perceived that the interference connected with the gradient terms of the second order represents the cause for image occlusions in multi-echo sequences.

The destructive interference at time $t_4$, i.e., with respect to the spin echo S2, however, can be avoided by adhering to the following condition for the respective gradient G:

$$\int_{t_0}^{t_1} G^2(t)dt = \frac{1}{2} \int_{t_1}^{t_3} G^2(t)dt \quad (20)$$

This condition is valid for all gradient directions since—as derives from equations 6, 7 and 12—the same dependency of $G^2$ exists in all spatial directions. Similar conditions must be met for all following echoes S2, S3, S4 ... Sn, so that the following general condition is obtained:

$$\int_{t_0}^{t_1} G^2(t)dt = \frac{1}{2} \int_{t_1}^{t_3} G^2(t)dt = \frac{1}{2} \int_{t_3}^{t_5} G^2(t)dt = \quad (21)$$

$$\ldots = \frac{1}{2} \int_{t_{2n-3}}^{t_{2n-1}} G^2(t)dt$$

Figure 2:
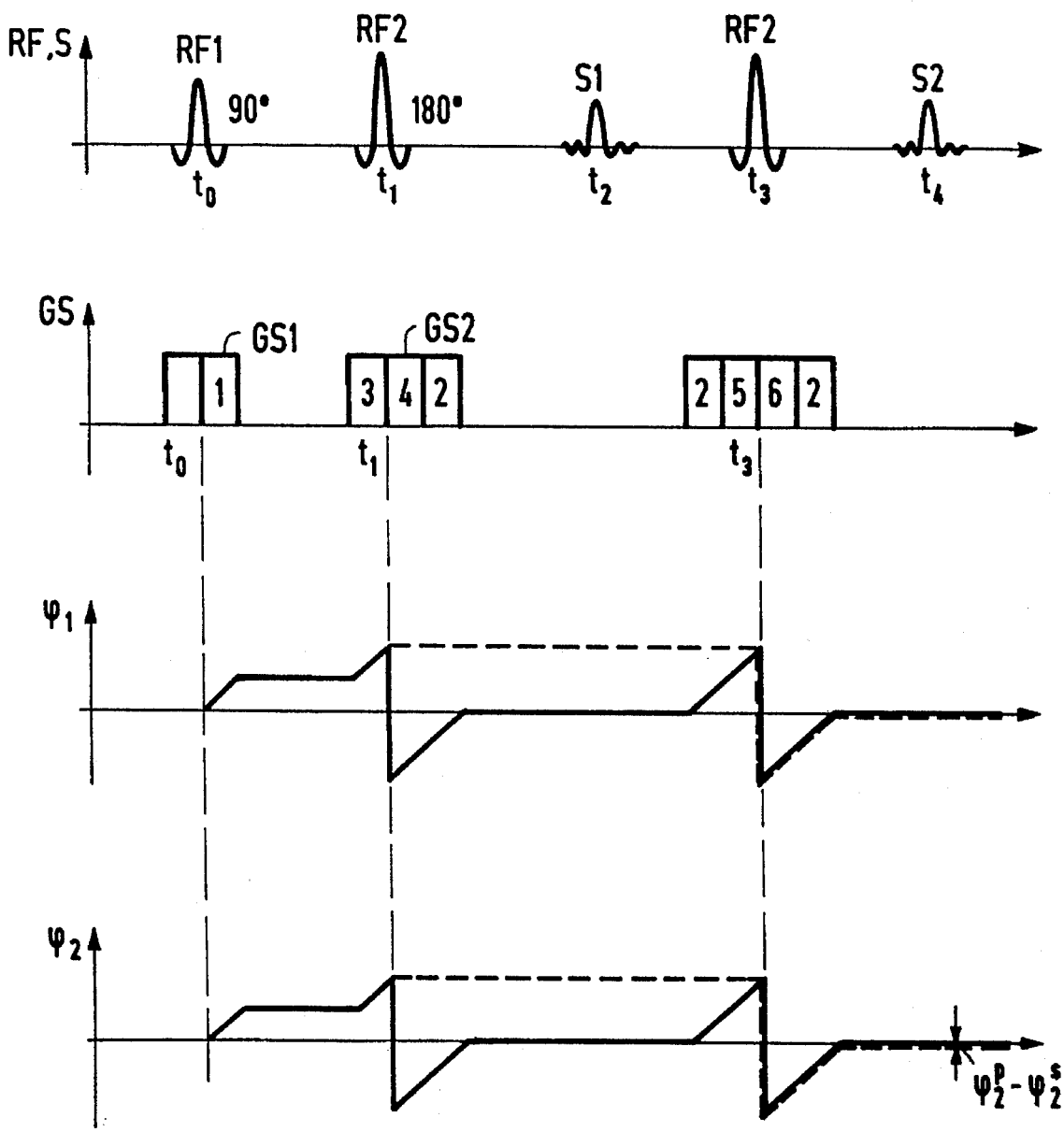
FIG. 2 shows a multi-echo pulse sequence with a modified pulse pattern for the slice-selection gradient GS as a first exemplary embodiment of the invention.

FIG. 2 shows an exemplary embodiment of a pulse sequence wherein the condition according to equation 21 is met for the slice-selection gradient $G_s$. The difference compared to the pulse sequence of FIG. 1 is that the sub-pulse 2 does not, as in FIG. 1, follow the slice-selection gradient $G_{S1}$, or the sub-pulse 1 thereof, but instead follows the slice-selection gradient $G_{S3}$, or the sub-pulse 4 thereof. Further, identical slice-selection pulses 2 are attached symmetrically at both sides of the following slice-selection gradient $G_s$. As may be seen from the curve of the phase $\phi_2$ shown in FIG. 2, the phase difference $\phi_2^p - \phi_2^s$ between the $\phi_2$ terms of the stimulated echo and the primary echo becomes 0, so that a constructive interference occurs.

The above considerations referred only to the slice-selection gradient. In practice, this leads to the largest interference since read-out gradients and phase-encoding gradients are usually smaller. The pulse sequence can also be selected such for these gradients, however, if the condition according to equation 21 is met.

Figure 3:
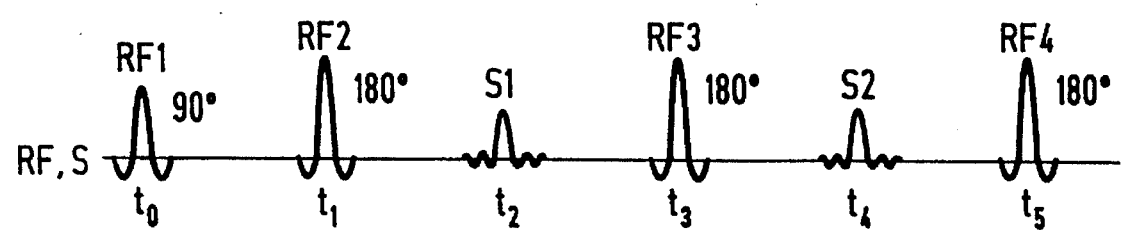
FIG. 3 shows a multi-echo pulse sequence with a conventionally activated read-out gradient GR.
Figure 3:
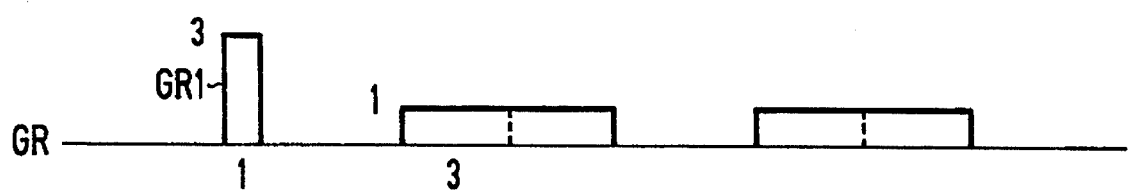
Figure 3:
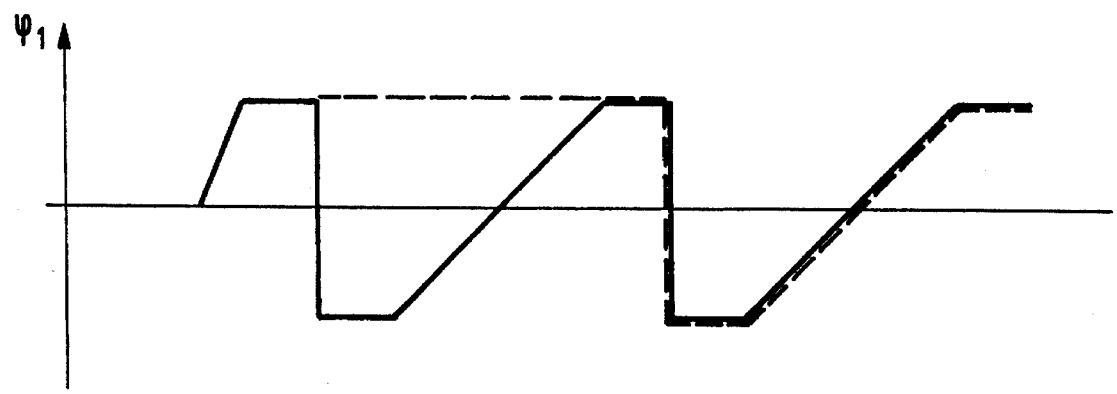
Figure 3:
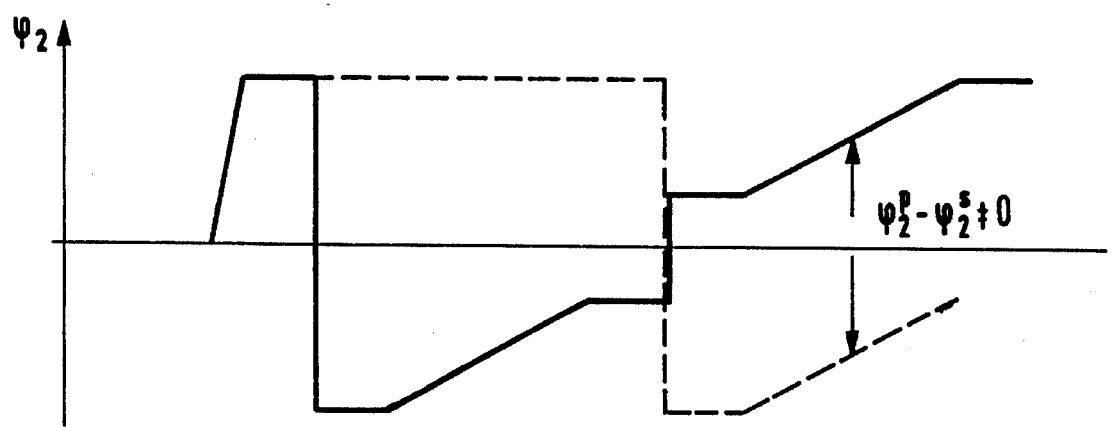

The phase-relationships for a read-out gradient GR are explained below with reference to FIGS. 3–6. FIG. 3 shows a conventionally activated read-out gradient GR. A gradient pulse GR1 is emitted in the read-out direction between the excitation radio-frequency pulse RF1 and the first refocusing radio-frequency pulse RF2; this gradient pulse GR1 should have a scaled length 1 and a scaled height 3 in the exemplary embodiment. The first spin echo S1, just like all following spin echoes, is read out under a read-out gradient GR having the scaled height 1 and the scaled length 2×3. As may be seen from the illustrated phase curve for the linear gradient terms, the spin echo signal S1 derives from a refocusing of the primary echo; stimulated echoes are also refocused in the following spin echoes. No phase equality occurs, however, with respect to the quadratic gradient terms. When the values assumed for the gradient GR are introduced into equation 21, then one can see:

$$\int_{t_0}^{t_1} GR^2(t)dt = 3^2 \cdot 1 = 9$$

$$\frac{1}{2} \int_{t_1}^{t_3} GR^2(t)dt = \frac{1}{2} \cdot 1^2 \cdot 6 = 3$$

Equation 21 is thus not satisfied. The phase difference $\phi_2^p - \phi_2^s$ that can lead to a destructive interference occurs given echo signal S2.

Figure 4:
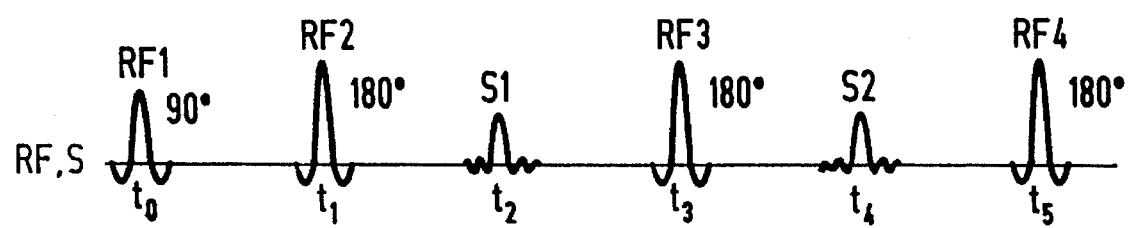
FIG. 4 shows a multi-echo pulse sequence with a pulse pattern for a read-out gradient as second exemplary embodiment of the invention.
Figure 4:
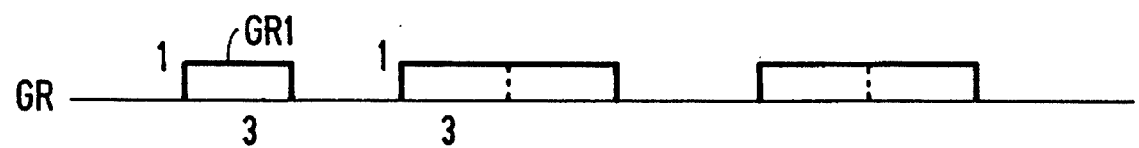
Figure 4:
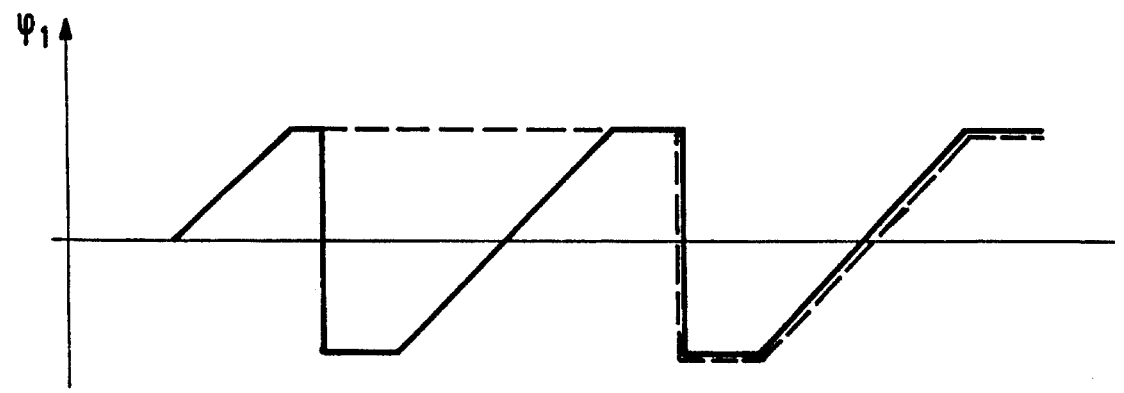
Figure 4:
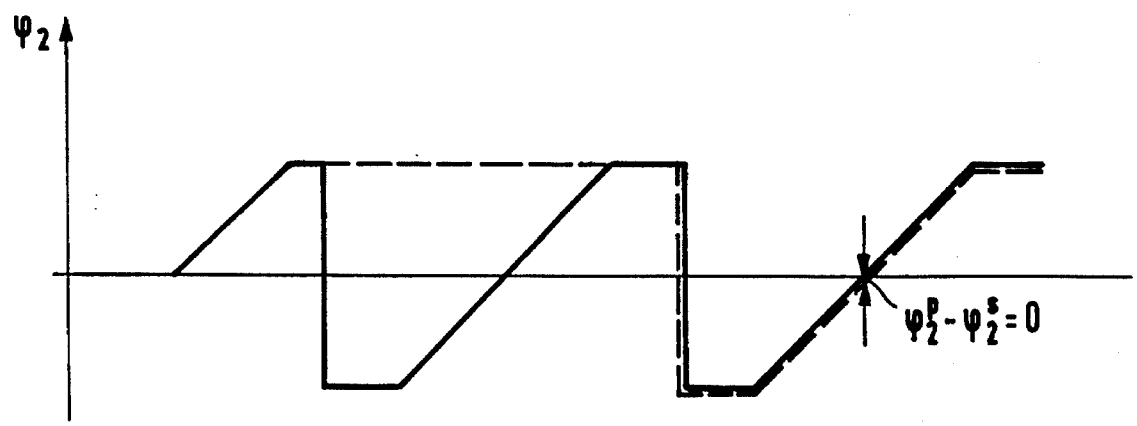

This, for example, can be avoided by making the first gradient GR1 longer, according to FIG. 4, whereby it has a scaled height 1 and scaled length 3 in the exemplary embodiment. The phase curve $\phi$1 with respect to the linear gradient term $\phi$1 thereby remains substantially unmodified; the rise steepness under the gradient GR1 merely becomes less. With respect the quadratic gradient term, however, only the same phase rotation under the gradient GR is achieved as with respect to the linear gradient term. The condition according to equation 21 is thus met:

$$\int_{t_0}^{t_1} GR^2(t)dt = 1^2 \cdot 3 = 3$$

$$\frac{1}{2}\int_{t_1}^{t_3} GR^2(t)dt = \frac{1}{2} \cdot 1 \cdot 6 = 3$$

As shown in FIG. 4, this results therein that no phase difference between the primary echo and the stimulated echo in spin-echo S2 as well as in the following spin echoes:

$$\phi_2^p - \phi_2^s = 0$$

A constructive superimposition of the two signal terms thus ensues.

Figure 5:
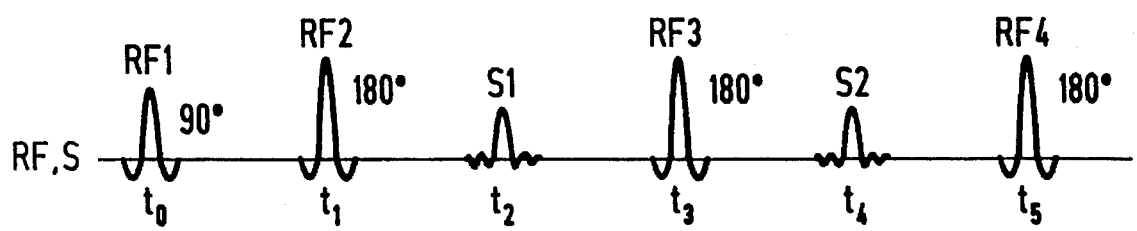
FIG. 5 shows a multi-echo pulse sequence with a conventional switching pattern for the read-out gradient GR.
Figure 5:
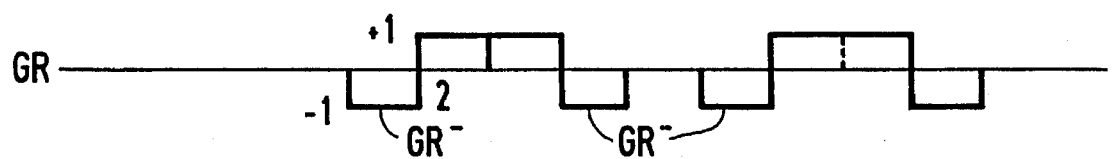
Figure 5:
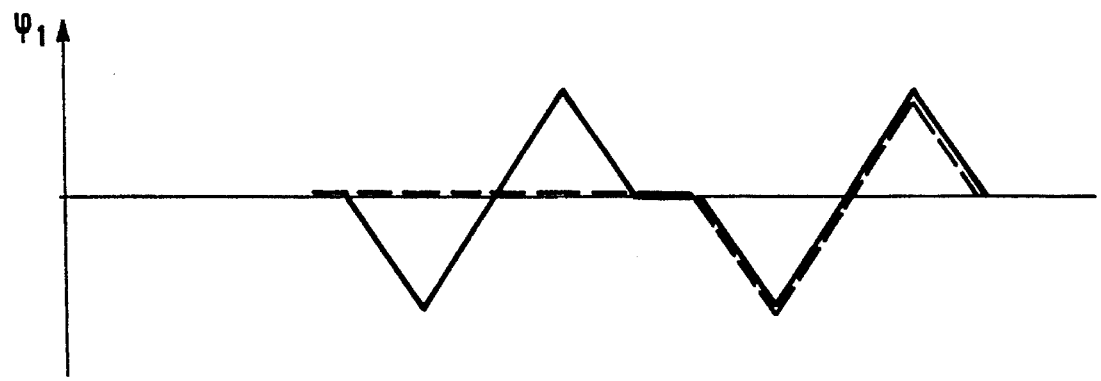
Figure 5:
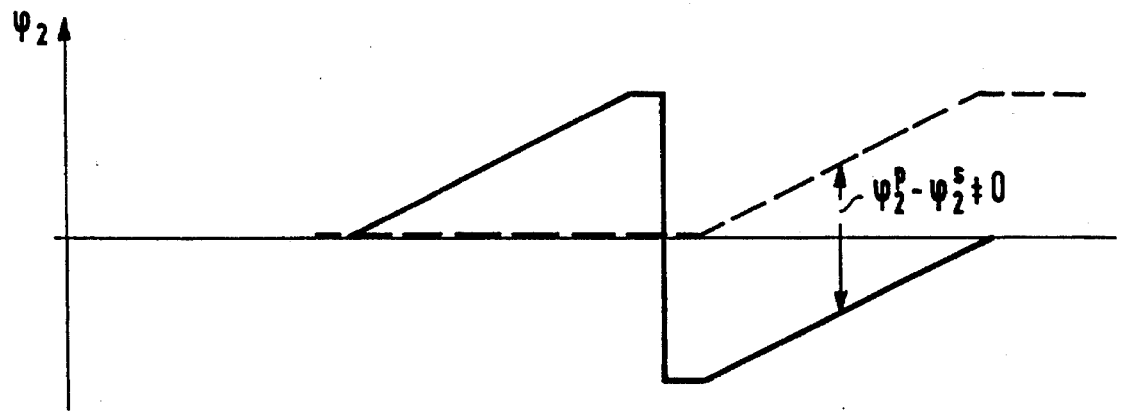

FIG. 5 shows a further exemplary embodiment of a conventional read-out gradient GR. In this case, the read-out gradient here is symmetrical to the respectively allocated echo time and has negative pulses at both sides thereof. In the exemplary embodiment, the positive part of each end of a read-out gradient has a scaled length of 2×2 and a scaled height of 1; the negative pulses respectively have a scaled length of 2 and a scaled height of −1. As the illustration of the phase φ1 shows, the phase deriving from the linear gradient re-phases exactly at the echo times with respect to the primary as well as with respect to the stimulated echoes. With respect to the quadratic gradient terms, however, a phase difference $\phi_2^p - \phi_2^s$ is present, for example at the time of the spin echo S2, between the primary and the stimulated echo path. Equation 21 is not satisfied, since $$\int_{t_0}^{t_1} GR^2(t)dt = 0$$

$$\frac{1}{2}\int_{t_1}^{t_3} GR^2(t)dt = \frac{1}{2}[(-1)^2 \cdot 2 + 1^2 \cdot 4 + (-1)^2 \cdot 2] = 4$$

Destructive interferences with signal quenching thus occur again.

Figure 6:
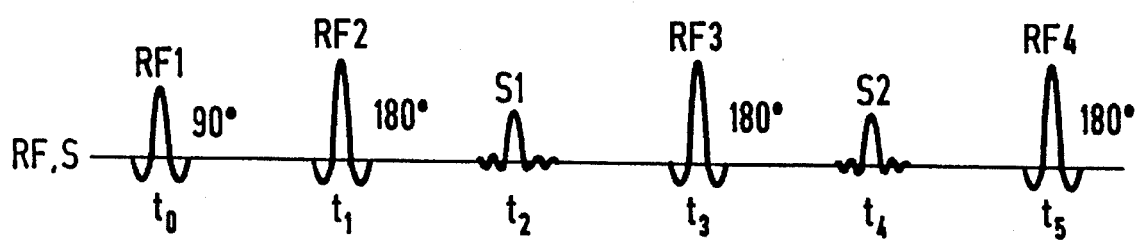
FIG. 6 shows a multi-echo pulse sequence with a switching pattern for the read-out gradient GR according to a third exemplary embodiment of the invention.
Figure 6:
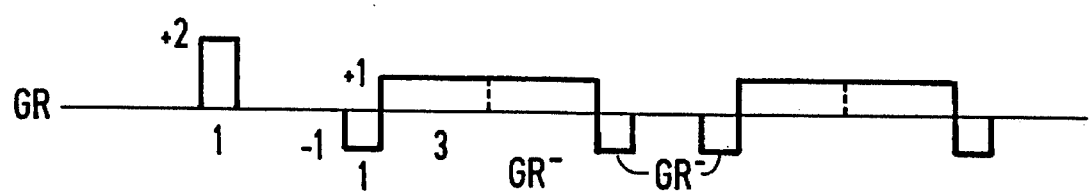
Figure 6:
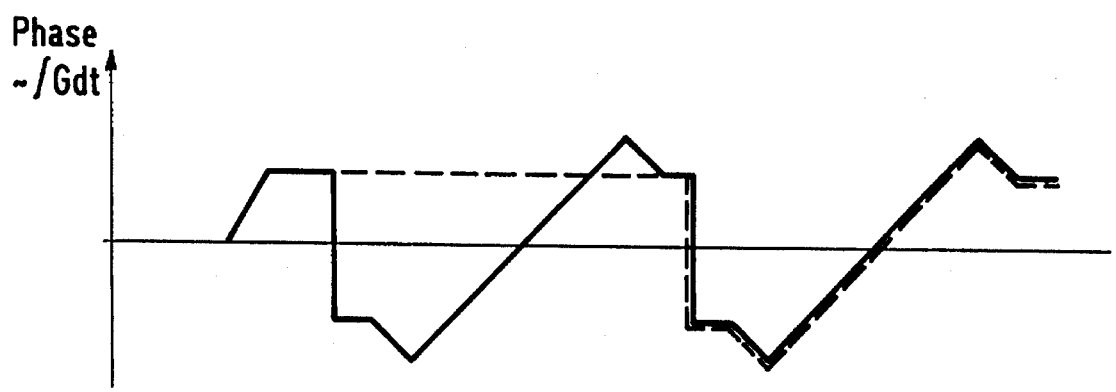
Figure 6:
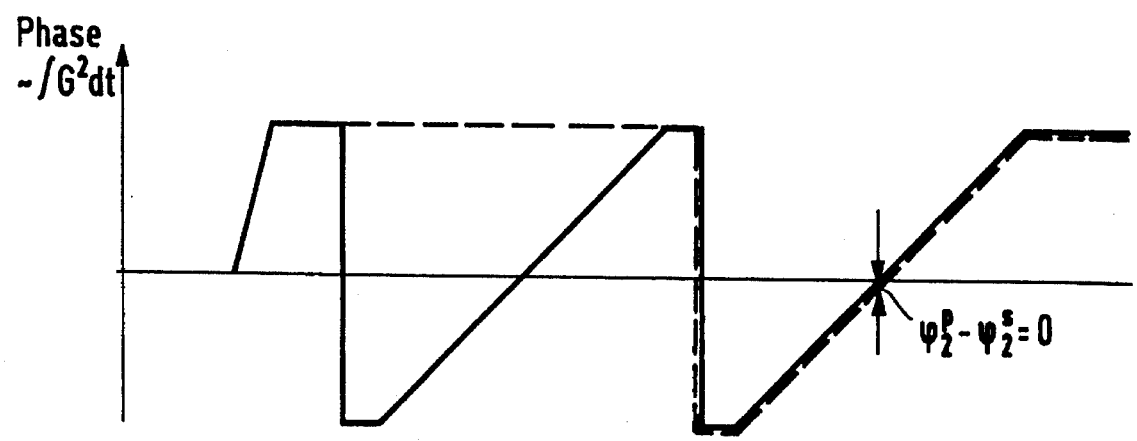

FIG. 6 shows an example of how the phase difference between the stimulated echo and the primary echo can be avoided given this sequence type. In the illustrated exemplary embodiment, the positive part of the read-out gradient GR is extended to the length 2×3 given unaltered amplitude 1; the negative sub-pulses, by contrast, are shortened to the length 1 given an unaltered amplitude −1. A positive gradient pulse GR having a scaled length 1 and a scaled height 2 is inserted between the excitation radio-frequency pulse RF1 and the first refocusing radio-frequency pulse RF2. With respect to the linear gradient term, the primary and the stimulated echo path again coincide beginning with the second spin echo S2. Differing from the conventional sequence of FIG. 5, however, the condition according to equation 21 is satisfied here, for example, at the second spin echo S2:

$$\int_{t_0}^{t_1} GR^2(t)dt = 2^2 \cdot 1 = 4$$

$$\frac{1}{2}\int_{t_1}^{t_3} GR^2(t)dt = \frac{1}{2}[(-1)^2 \cdot 1 + 1^2 \cdot 6 + (-1)^2 \cdot 1] = 4$$

thereby valid is:

so that $\phi_2^p - \phi_2^p = 0$, i.e., primary and stimulated echo are constructively superimposed.

Figure 7:
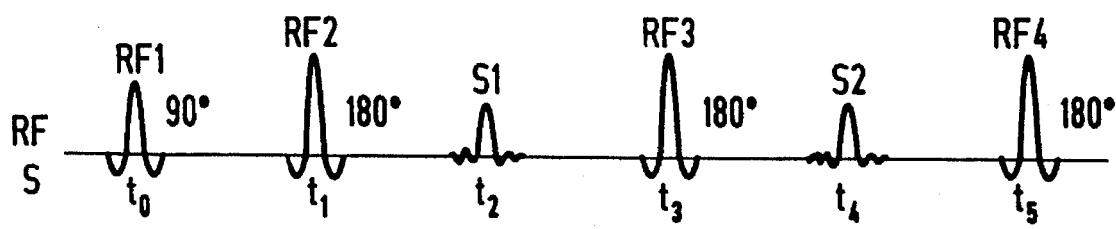
FIG. 7 shows a multi-echo pulse sequence with a conventionally activated pphase-encodinggradient GP.
Figure 7:
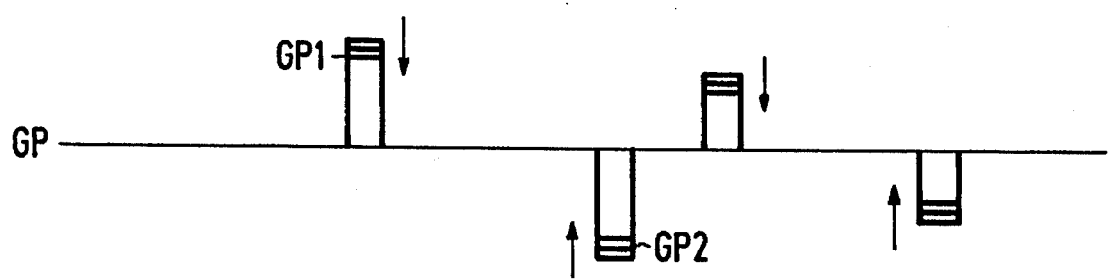
Figure 7:
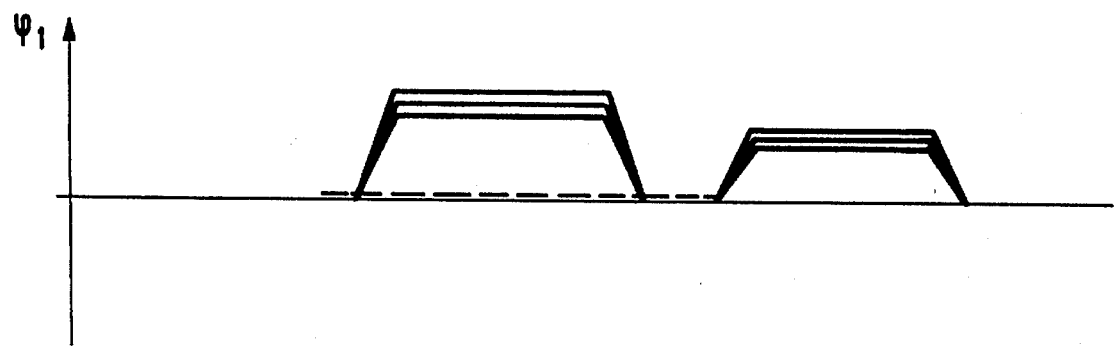
Figure 7:
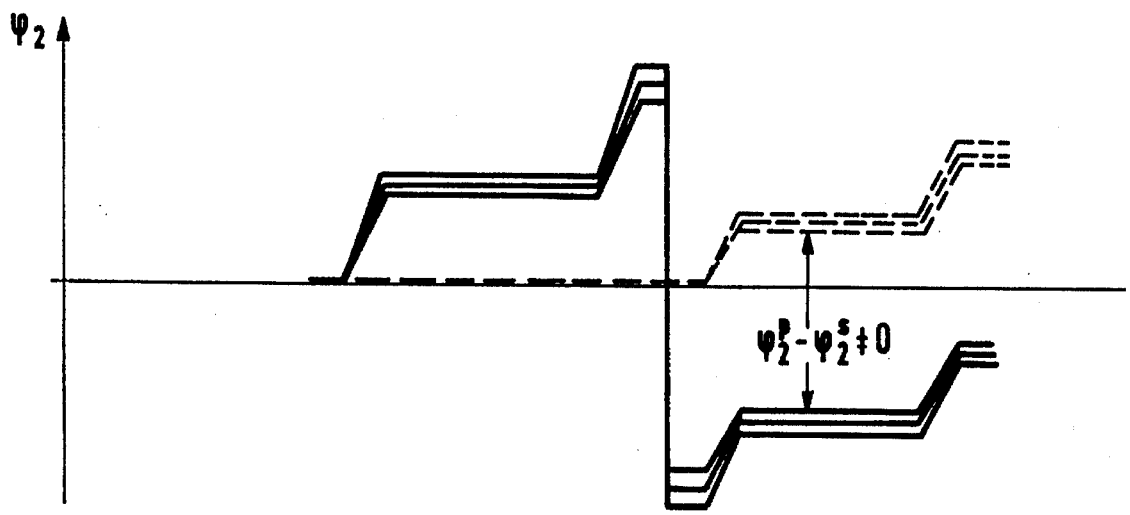
Figure 8:
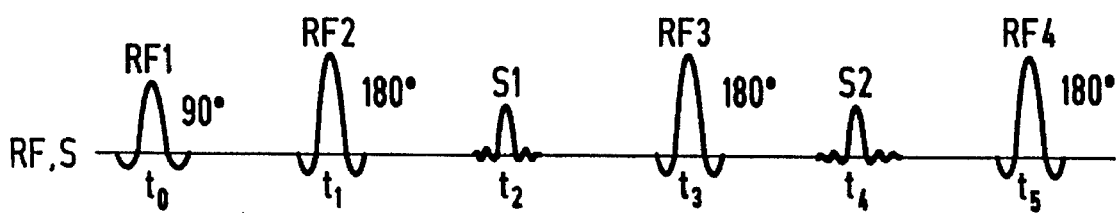
FIG. 8 shows a multi-echo pulse sequence with a switching pattern for the pphase-encodinggradient GP according to an exemplary embodiment of the invention.
Figure 8:
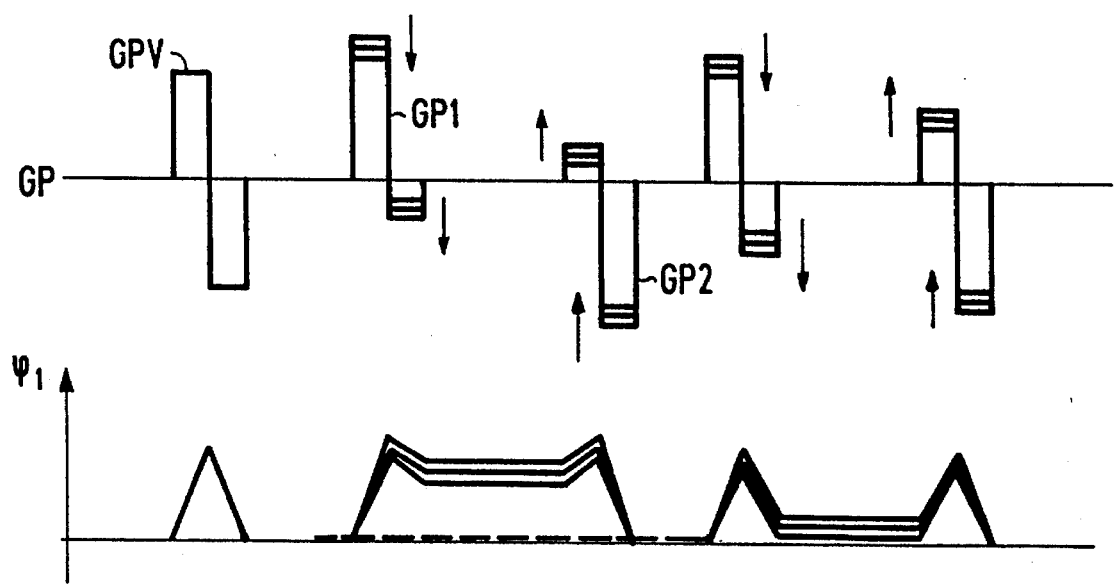
Figure 8:
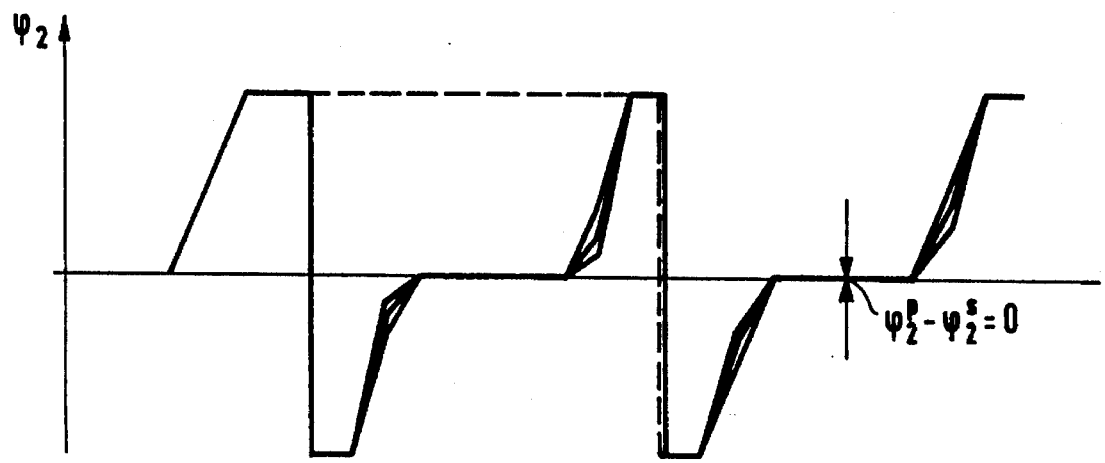

FIGS. 7 and 8, also show an example of a phase-encoding gradient GP. Every spin echo S1, S2 ... is thereby differently phase-encoded with a phase-encoding gradient advanced step-by-step. The step-by-step advance is indicated in FIG. 7 by the lines in the gradient GP. After every spin echo S1, S2..., the phase coding is in turn reset by a gradient having the same amplitude but the opposite direction. A consideration of the phase curves φ1 and φ2 for the respective stimulated and primary echo paths also shows here that conventional pulse sequences in the phase-encoding direction lead to a phase difference between primary and stimulated echo with respect to the quadratic gradient terms, and thus problems with image quality can occur.

An exemplary embodiment of a solution of this problem with respect to the pphase-encodingdirection is shown in FIG. 8. A bipolar gradient in the phase-encoding direction is thereby inserted between the excitation radio-frequency pulse RF1 and the first refocusing radio-frequency pulse RF2. Further, every phase-encoding pulse is bipolar, just like the re-phasing pulses inserted after the spin echoes. The condition according to equation 21 can be satisfied with such a pulse sequence, so that the phase deviations between primary and stimulated echo paths become 0 given quadratic gradient terms as well.

It must be emphasized that the illustrated gradient sequences represent only some of many possibilities for satisfying the condition according to equation 21, and thus for avoiding interferences and the image occlusions connected therewith. This principle can likewise be applied not only to the illustrated turbo-spin echo sequence but—as initially recited—to any arbitrary multi-echo sequence.

Although modifications and changes may be suggested by those skilled in the art, it is the intention of the inventors to embody within the patent warranted hereon all changes and modifications as reasonably and properly come within the scope of their contribution to the art.

We claim as our invention:

1. A method for avoiding image occlusions in a nuclear magnetic resonance tomography apparatus operated with a multi-echo sequence comprises the steps of:

generating a cross-magnetization of spins in an examination subject at a time $t_0$ with an excitation radio-frequency pulse, resulting in nuclear magnetic resonance signals in said examination subject;

emitting at least two refocusing radio-frequency pulses following said excitation radio-frequency pulse at time $t_1, t_3, t_5$ ... to re-phase the cross-magnetization;

activating gradients G(t) which satisfy the following condition in at least one direction:

$$\int_{t_0}^{t_1} G^2(t)dt = \frac{1}{2}\int_{t_1}^{t_3} G^2(t)dt =$$

$$\frac{1}{2}\int_{t_3}^{t_5} G^2(t)dt = \ldots = \frac{1}{2}\int_{t_{2n-3}}^{t_{2n-1}} G^2(t)dt$$

wherein n is a natural number;

reading out the resulting nuclear magnetic resonance signals at times $t_2, t_4, t_6$ ...

2. A method as claimed in claim 1 wherein the step of activating gradients G(t) comprises activating said gradients G(t) which satisfy said condition in all spatial directions.

3. A method as claimed in claim 1 comprising the additional steps of:

emitting each excitation radio-frequency pulse and each refocusing radio-frequency pulse in the presence of a slice-selection gradient;

following the slice-selection gradient for a first refocusing radio-frequency pulse with a further gradient in a slice-selection direction, said further gradient having an amplitude equal to an amplitude of the slice-selection gradient for the excitation radio-frequency pulse and having a duration which is half as long; and preceding and following each subsequent slice-selection gradient with a gradient identical to said further gradient.

4. A method as claimed in claim 1 wherein the step of reading out the resulting nuclear magnetic resonance signals comprises reading out the resulting nuclear magnetic resonance signals under a read-out gradient having a duration T and an amplitude A, and comprising the additional step of generating a pre-phasing pulse in a read out direction between the excitation radio-frequency pulse and a first refocusing radio-frequency pulse, said pre-phasing pulse having an amplitude A and a duration T/2.

5. A method as claimed in claim 1 wherein the step of reading out the resulting nuclear magnetic resonance signals comprises reading out the resulting nuclear magnetic resonance signals under a read out gradient having a duration T and an amplitude A defining a duration/amplitude product, and comprising the additional steps of:

activating an inverse read-out gradient preceding and following each read-out gradient, with a sum of the duration/amplitude products of the respective inverse read-out gradients preceding and following a read-out gradient being less than the duration/amplitude product of that read-out gradient; and emitting a pre-phasing pulse in a read-out direction between the excitation radio-frequency pulse and a first refocusing radio-frequency pulse, said pre-phasing pulse having a duration/time product selected so that said condition is met for all of the gradients in the read-out direction.

6. A method as claimed in claim 1 comprising the additional steps of:

generating a first bipolar phase-encoding gradient before each nuclear magnetic resonance signal, said first phase-encoding gradient having a duration and an amplitude defining a duration/amplitude product, and increasing said duration/amplitude product step-by-step for each first phase-encoding gradient from nuclear magnetic resonance signal-to-nuclear magnetic resonance signal;

generating a second bipolar phase-encoding gradient, having an opposite direction to said first phase-encoding gradient and a same duration/amplitude product, after each nuclear magnetic resonance signal and advancing said duration/amplitude product of said second phase-encoding gradient step-by-step from nuclear magnetic resonance signal-to-nuclear magnetic resonance signal;

emitting a bipolar pre-phasing gradient between the excitation radio-frequency pulse and a first refocusing radio-frequency pulse; and matching said first and second phase-encoding gradients and said bipolar pre-phasing gradient to each other so that said condition is met.

\* \* \* \* \*